(12) United States Patent
Chiba et al.

(10) Patent No.: US 6,437,454 B1
(45) Date of Patent: Aug. 20, 2002

(54) SEMICONDUCTOR BASE MATERIAL HAVING FINE DOT MARK

(75) Inventors: Teiichirou Chiba; Ryusuke Komura; Akira Mori, all of Kanagawa-ken (JP)

(73) Assignee: Komatsu Limited, Tokyo (JP)

( * ) Notice: Subject to any disclaimer, the term of this patent is extended or adjusted under 35 U.S.C. 154(b) by 0 days.

(21) Appl. No.: 09/687,995

(22) Filed: Oct. 13, 2000

(30) Foreign Application Priority Data

Oct. 20, 1999 (JP) .............................. 11-298410

(51) Int. Cl.[7] .............................. H01L 23/58

(52) U.S. Cl. ...................................... 257/798

(58) Field of Search .......................... 257/798; 438/401, 438/799

(56) References Cited

U.S. PATENT DOCUMENTS 4,847,183 A * 7/1989 Kruger

* cited by examiner

Primary Examiner—Michael Sherry
Assistant Examiner—Evan Pert
(74) Attorney, Agent, or Firm—Bell, Boyd & Lloyd LLC

(57) ABSTRACT

A dot mark having at its center a peaked portion rising from a face to be marked is provided on a cut face or ground face of a semiconductor wafer with the face to be marked having surface roughness of 0.3 μm or less. The rising dot mark is 1 to 15 μm in maximum length along the face to be marked and 0.01 to 5 μm in height. With even such a fine size, the dot mark is superior in visibility. This makes it possible to provide a semiconductor base material in which all processing histories in a process for manufacturing a semiconductor wafer and a semiconductor, wafer ID, chip ID, and manufacturing number or the like can be recognized.

2 Claims, 15 Drawing Sheets

10.00×10.00 [μm]   Z-Max 114.87 [nm]

10.00×10.00 [μm]

10.00×10.00 [μm]

10.00×10.00 [μm]

30.00×30.00 [μm]

SEMICONDUCTOR BASE MATERIAL HAVING FINE DOT MARK

BACKGROUND OF THE INVENTION

1. Field of the Invention

The present invention relates to a semiconductor base material having a dot mark employed for processing history, product management and the like in a manufacturing process of a semiconductor wafer or a semiconductor device. More particularly, the present invention relates to a semiconductor base material having a dot mark formed in such a region that least influence on subsequent reading precision in a process for manufacturing a semiconductor wafer and a semiconductor device and is free from influence on electric characteristics of the wafer itself, the dot mark having a desired amount of information allocated therein and a fine, specific and readable shape by means of laser irradiation.

2. Description of the Related Art

In a semiconductor manufacturing process, for example, it is required to set various and strict manufacturing conditions in each step. In order to manage these conditions, a mark consisting of numeric, characters, bar codes or the like is dot displayed on a partial surface of a semiconductor wafer. Meanwhile, there are a hundred or more steps of manufacturing a semiconductor, and moreover, a number of element-forming processes or flattening processes are performed in each step. These processes include, for example, resist application, reductive projection of a pattern onto a resist, resist developing, and flattening by forming various films such as insulation film or metal film for embedding a gap generated by copper wires or the like.

On the other hand, the foregoing dot shaped mark is generally formed by irradiating a partial surface of a semiconductor wafer with continuous pulse laser beam via an optical system. Moreover, marking for that purpose is not limited to once, but the required minimum of history data is often marked in each manufacturing process in order to recognize the history characteristics of each manufacturing process. However, the marking region in the semiconductor wafer is limited to a very small area. Thus, the dot size and number of dots to be marked are limited, and the marking region, dot size, the number of dots are specified in accordance with the SEMI specification and the like.

In a dot marked semiconductor wafer, as disclosed in Japanese Patent Laid-open Publication No. 2-299216, for example, a change in reflection factor cause by He-Ne laser beam irradiation or a change in thermal wave vibration of general laser beam is read. Based on the thus read information, various manufacturing conditions in the subsequent manufacturing steps are set. Therefore, in a case where the aforementioned reading is not made accurately, and incorrect information is read, all items are found to be faulty except that they are correctly read incidentally. A majority of causes of such reading fault is caused by unclearness of the mark formed by dot marking. One of the factors of this blurring is attributed to the shape of a dot forming a mark.

In general, mark reading is greatly influenced by dot depth. In order to obtain a required dot depth, as disclosed in Japanese Patent Laid-open Publication No. 60-37716, for example, part of a semiconductor wafer is generally fused and removed in a spot shape by laser beam irradiation with one large energy, thereby forming a dot. In this case, the thus fused and removed object is deposited high in the peripheral portion of the dot. Or, the fused and removed object is scattered to adhere to the peripheral portion of the dot, so that it makes it impossible to form an element and degrade a quality of the product. Further, in a case of YAG laser dot marking, variation is prone to occur in laser output due to specificity of the YAG laser or its Q switch operation, so that deviation in the dot depth or size occurs.

In order to eliminate such fault, according to Japanese Patent Laid-open Publication No. 59-84515 and Japanese Patent Laid-open Publication No. 2-205281, pulse laser beam with comparatively small energy is irradiated at the same point so as to be overlapped. In the former publication, the dot diameter is reduced sequentially in each pulse in forming one dot mark, and the laser beam is irradiated at the same point several times so as to be overlapped. Then, while the dot hole diameter is reduced sequentially, a deep dot is formed. In the latter publication, the first laser pulse irradiation is set at a frequency of 1 KHz or less, and a frequency of the subsequently irradiated laser pulse is set at a high repetition of 2 to 5 KHz, whereby a dot of 0.5 to 1.0 $\mu$m or 1.0 to 1.5 $\mu$m in depth is formed.

On the other hand, according to the aforementioned marking methods, an occurrence of dust cannot be eliminated. Therefore, a laser marking method having a superior visibility and less occurrence of dust is proposed in Japanese Patent Laid-open Publication No 10-4040, for example. This publication discloses a laser marking method irradiating pulse laser beam, thereby projecting a liquid crystal mask pattern onto a semiconductor material surface to making a dot mark, wherein the energy density is set to be 18 to 40 $J/cm^2$; the pulse width is set to be in a range of 0.05 to 0.40 ms; pulse laser beam is irradiated to a semiconductor material surface; and a number of fine projections are generated in a laser irradiation region in a process in which the semiconductor material surface is fused and re-crystallized.

According to this marking method, a number of fine projections of substantially 1 $\mu$m or less in height, 0.5 to 1.0 $\mu$m in diameter, substantially 1.5 to 2.5 $\mu$m in mutual interval, and 1.6 to $4.5 \times 10^7$ pieces/$cm^2$ in density are formed on a surface of a object to be marked by laser beam irradiation passing through a unit of one pixel. Due to random light reflection caused by such a large number of fine projections, a dot mark formed has superior visibility, and moreover, an occurrence of dust can be prevented during the marking.

It is evident that one of the causes for the unclearness (herein, referred to as visibility) in reading a dot lies in its depth as mentioned above. Even if a dot depth is made to be deep, in a case where a diameter of an opening of the dot is large, when sufficient laser beam is irradiated in order to obtain a required depth, the dot has a smoothly curved face consisting of a gentle inclined face as a whole because the energy density is generally defined in a Gaussian distribution. Therefore, a difference from the periphery of the dot cannot be discriminated by the aforementioned reading means. The foregoing Japanese Patent Laid-open Publication No. 2-205281 specifically describes that the dot depth is 0.5 to 1.0 $\mu$m or 1.0 to 1.5 $\mu$m as described above. This publication fails to describe a diameter of the dot, and merely describes that the dot shape is a Gaussian shape.

In addition, the above Japanese Patent Laid-open Publication No. 59-84515 discloses that the opening diameter of a first dot is 100 to 200 $\mu$m while its depth is I am or less. Specifically, this publication describes that laser beam irradiation are made four times. In this case, the dot depth is at most 3 to 4 $\mu$m. In addition, from the accompanying drawings of the publication, the dot shape formed at the first time is similar to a Gaussian shape.

Therefore, it can be considered that a dot with a required depth and a uniform size to a certain degree can be formed according to these marking methods as disclosed in these publications. However, the formed dot shape is close to a conventional shape, and its diameter is large with respect to its depth. Thus, it is still lack of visibility. Further, remarkable disclosure is not made in that the size (diameter) of the formed dot is made to be fine. Therefore, 50 to 150 μm that is a conventional size has not yet been changed by these prior inventions. Thus, it is merely defined based on a value as specified in accordance with the SEMI specification or the like at the present time, so that a significant increase cannot be substantially expected with respect to the number of dots and the dot forming region, and it is still difficult to mark a variety of information.

In the meantime, visibility of a dot mark as described above is improved in a case where there is a large difference in light reflection direction in a mark and its periphery and its reflection quantity. Therefore, as has been already described, in a case where a hole is relatively deep with respect to an opening diameter of the dot, the visibility is improved. This is because the admitted reflection light inside of the hole at a constant incident angle is not uniform in its reflection direction but is randomly reflected, so that only little reflection light is emitted from the opening of the hole to the outside, and on the other hand, if it is presumed that a peripheral portion of the hole is smooth, the reflection light at the peripheral portion is reflected in a predetermined directions, and thus, the brightness is increased. In a case where a difference in the brightness is great, the visibility is considered to be improved.

Hence, a fine projection formed by the marking method disclosed in Japanese Patent Laid-open Publication No. 10-4040 is so fine that the individual projections cannot be observed. In addition, because there is a small difference between a random reflection light quantity of a random reflection face that is a collective face of these projections and a reflection light quantity of a smooth face, it is difficult to discriminate between the random reflection face and the peripheral smooth face, so that the visibility is still inferior. Further, since there is no remarkable description of the size of one dot mark consisting of a collection of these fine projections, the size of the dot can be considered to be identical to the size of a conventional dot. Thus, a dot mark-making region is limited. Furthermore, even if it is presumed to include a case in which the size of one dot obtained is fine, a plurality of fine protrusions disperses in one dot, so that the visibility of one dot is lowered more significantly.

On the other hand, with development of information industry in recent years, there are more types of information industrial devices. A large amount of semiconductor devices have been manufactured with an increase in its demand, and are mounted on various types of devices in a plenty of fields. As a result, faults due to various causes frequently occur with these devices. A semiconductor device may often cause such faults, particularly by its circuit chip. In a case where such a fault is caused by a circuit chip, there is no way to recognize in what step such fault has occurred in the circuit chip manufacturing process.

Even in the aforementioned semiconductor wafer manufacturing process, a processing history or the like is merely recorded by means of making in units of cassettes. Thus, at present, it is impossible to record the processing history in detail for every circuit chip. Therefore, even if a faulty circuit chip is recalled, a processing history, which describes processes from a wafer to the circuit chip, cannot be identified. Further, the circuit chip is merely one of a number of circuit chips manufactured from one semiconductor wafer. Therefore, In a case where a fault of the circuit chip is caused in the wafer manufacturing process for example, although there is a high possibility that the similar faulty chips are installed in a number of devices, it is impossible to recollect and inspect such chips. This can be applied to circuit chips as well as wafer.

Recently, with a larger size of a semiconductor wafer and the user's demand, there have been many cases in which different types of semiconductor devices are manufactured on a single semiconductor wafer. For example, in a circuit chip manufacture, when common circuits are manufactured in predetermined steps and then must be apportioned to two different circuit manufacturing processes, the semiconductor wafer is cut in a region required for such apportion. In such case, the chip having integrated circuits of two different types has the same processing histories until such apportion is made. Then, the chips have processing histories different from each other in the subsequent steps until the final product has been assembled.

However, under the present conditions in which a technique for making a fine mark having such a shape that is reliably readable is not established as described above, a processing history in the respective steps from a circuit chip manufacturing step to final assembling step is not clearly recorded in units of circuit chips. Even if it is found that a circuit chip is faulty, it is impossible to identify when or what step of process such fault has occurred.

SUMMARY OF THE INVENTION

The present invention has been made to solve these problems. Specifically, an object of the present invention is to provide a semiconductor base material making it possible to recognize all the processing histories in semiconductor wafer and semiconductor manufacturing process, wafer ID, chip ID, manufacturing number and the like.

In order to achieve the foregoing object, the inventors made detailed study and analysis with respect to a conventional dot marking apparatus of such type, a marking method, and a dot shape to be formed thereby. The inventors have found that, although a fine dot was formed, reliable visibility was mainly caused by a dot shape, but it was impossible to achieve such an ideal shape of a dot by a conventional marking apparatus and method.

Specifically, as shown in FIG. 2 and as disclosed in the above Japanese Patent Laid-open Publication No. 2-205281 for example, according to a conventional marking apparatus, character input and a marking mode for being printed on a semiconductor wafer are first set at an input section 21. In order to mark a dot with its predetermined depth on a wafer W in accordance with the set marking mode, a marker controller 22 controls an ultrasonic Q switch element 23, an internal shutter 24, an external shutter 25, an attenuator (light attenuator) 26 and a galvano mirror 27, and makes marking to a single dot at one Q switch pulse. In FIG. 2, reference numeral 11 denotes a full reflection mirror; reference numeral 12 denotes an internal aperture (mode selector); reference numeral 13 denotes a lamp house; reference numeral 14 denotes an output mirror; reference numeral 15 denotes an aperture; reference numeral 16 denotes a leveling mirror; reference numeral 17 denotes a galileo type expander; reference numeral 18 denotes an aperture; reference numeral 19 denotes an f-θ lens; and reference numeral 20 denotes a TAG laser oscillator.

According to such general marking system, the energy density distribution of laser beam irradiated onto a semiconductor wafer surface exhibits a Gaussian shape as described above. Thus, a dot formed on the wafer surface is also influenced by the energy density distribution, and the interior face of the dot forms a gentle curve face. These marking methods are based on the invention disclosed in U.S. Pat. No. 4,522,656. This U.S. patent is characterized in that a laser beam having its diameter that is 1.5 to 6.5 times as large as a dot diameter to be marked is irradiated to the wafer surface, so that the peripheral thermal transmission is prevented, and a center portion of an irradiation point is fused by effectively using the energy, thereby forming a hole.

Namely, in a method of efficiently using the energy density of laser beam distributed in a Gaussian shape, the energy of the laser beam in an outer:range of said energy density distribution shape where intensity of the laser beam is low is irradiated to a periphery of the hole processing portion, thereby warming the hole peripheral portion. Then, a loss of the thermal energy caused by thermal transmission from the center portion of the hole is prevented, so that the hole processing is effectively achieved at the center portion. However, part of the laser energy is not used for the hole processing directly and is only consumed, which causes low efficiency. Furthermore, heating history remains at the hole peripheral portion by the laser irradiation to the hole periphery, and therefore, product quality can be degraded. Moreover, as described above, in marking using this method, only a dot mark having a large dot diameter and shallow in depth can be formed, and the hole periphery protrudes, thus visibility is further lowered.

During various studies, the inventors attempted to emit light to a projection and its periphery obliquely from above, and receive random reflection light on the irradiated face by means of an image receiver. The inventors then found that an apex portion of the projection was very high in luminance in comparison with its periphery portion. From this phenomenon, when an attempt was made to read a dot mark from a reflection light that was made by irradiating parallel light coherent to a dot mark consisting of a conventional hole shape, it resulted in that the central hole portion was dark, and its periphery was changed continuously from a ring shaped bright portion to a further brighter portion, and further, by the presence of a peaked portion on a ring of the hole periphery, a shade of the peaked portion appeared, so that it is often difficult to recognize the dot because of such difference in brightness. In contrast, when an attempt was made to read a dot mark by scattering light on a protruded dot mark on a light irradiation face, the inventors. have found that an apex portion of the dot mark shines with higher luminance about its one point, so that a difference in brightness from its periphery becomes very large. Thus, the presence of the dot mark could be recognized reliably even if the mark was fine in size.

As a result of repeated studies about producing a shape of a dot mark with superior visibility, it was confirmed as follows. If the pulse width of laser beam and energy density are set within a predetermined range which will be described later, and the energy density distribution is controlled, a shape of a dot mark formed in a unit of laser beam irradiated onto a surface of an object to be marked assumes a specific shape in which a center portion protrudes, which was not known conventionally. With respect to its visibility, such dot mark is superior, in spite of a single, fine dot mark, in comparison with a dot mark shape having a depressed hole shape formed by the conventional laser marking.

Hence, the inventors thought that such dot mark having a fine and characteristic shape and superior visibility would have a limited visibility depending on a face on which the dot mark is formed, and promoted investigation for a surface roughness of its formed face. As a result, because of a dot mark having its characteristic shape in which its center portion protrudes as described above, it was verified that visibility can be ensured in a whole region on a processing face other than the circuit face of a circuit chip, even if the dot is fine. Thus, the present invention has been made as follows.

That is, according to a first aspect of the present invention, there is provided a semiconductor base material, wherein a dot mark having at its center a peaked portion rising from a face to be marked is provided on a cut face or ground face of a semiconductor wafer (W), a maximum width of the rising dot mark along the face to be marked being 1 to 15 $\mu$m in maximum length and 0.01 to 5 $\mu$m in height.

Although a principle of forming a dot mark having such specific shape is not evident, a typical principle of forming such dot mark at present can be presumed as follows.

That is, when laser beam are irradiated to an individual one of the dot forming regions, the object surface to be marked at the thus irradiated portions is fused, and a pond (hereinafter, referred to as a "fused pond") of the fused object material is formed. At this time, the fused material is lower in temperature at a portion closer to a shore of the fused pond, and is higher in temperature at a portion closer to a center portion thereof. A distribution in the surface tension occurs due to this temperature gradient, so that movement takes place in the fused material. Then, cooling starts at the same time as when pulse irradiation stops, resulting in coagulation. In a state in which the material is fused, the center portion of the fused pond is a free interface, and the shore of the fused pond corresponds to a fixed end so that it is in the same state as a film with a fixed margin. In this state, the surface tension acts as a dynamic motion similar to film vibration at the center portion of the fused pond.

A length per amplitude in a film vibration mode is almost determined depending on the material specific viscosity or surface tension. Therefore, the vibration frequency is increased, as a diameter of the fused pond is larger. For example, in a case of silicon, its length per amplitude is about 3 to 5 $\mu$m, so that a fine dot shape having effective elevation in a fine region can be obtained. Furthermore, it has been verified experimentally that a dot mark can be formed in a fine region with almost no influence of gravity.

In a case where a laser emission pattern is rectangular, the fused pond also becomes rectangular. In a case where the laser emission pattern is circular, the fused pond also assumes a circular shape. Similarly to the film, its vibration acts in such a mode that corresponds to the rectangular or circular shape. FIGS. 12 to 21 specifically show rectangular and circular film vibration modes. As each of the vibration modes enters high order, the vibration frequency increases, and reciprocating movement between a depression pattern and a protrusion pattern occurs. It can be understood from the experimental result that will be described later that the motion in this fused bond strongly correlates with film vibration.

FIG. 12 shows a circular film vibration mode in which a curved face protrudes upwardly from a surface of the object to be marked. Conversely, FIG. 13 shows a circular film vibration mode in which depression with a curved face is formed downwardly from the surface of the object to be marked. FIG. 14 shows a circular film vibration mode in which ring shaped depression is formed on the surface of the object to be marked with a projection in a substantially cone shape extending upwardly from a center of the ring. FIG. 15 shows a circular film vibration mode in which a ring shaped peaked portion is formed on the surface of the object to be marked with depression with a curved face is formed downwardly from a center of the ring. FIG. 16 shows a circular film vibration mode, in which a ring shaped peaked portion is formed on the surface of the object to be marked with a projection in a substantial cone shape extending upwardly from a center of the ring. FIG. 17 shows a circular film vibration mode in which ring shaped depression is defined as an outer most rim portion on the surface of the object to be marked, and a peaked portion and depression are alternately arranged concentrically.

FIGS. 18 to 21 show a rectangular film vibration mode corresponding to FIGS. 12 to 15, respectively. In this case, FIG. 21 is different in that a wave shaped peaked portion is formed in such a manner that it is protruded largely at rectangular corners, instead of being a simple ring shaped peaked portion.

Thus, a specific dot mark shape according to such aspects of film vibration modes has been found to be much more fine in size than conventional ones, as a result of a number of experiments. As described above, it has been verified that such marking conditions can be obtained by setting the pulse width and energy density of laser beam in a predetermined range, and controlling the energy density distribution.

Of course, the foregoing description could be merely one reasoning. Therefore, as a result of further experiments, the aforementioned fine dot mark having a protruding shape in the present invention can be considered to be formed by a "mechanism of generating fine liquid droplets caused by a liquid face in a weightless state".

That is, the surface tension energy of a liquid material acts in such a direction that it is always minimal The surface tension energy is in proportion to the surface area of the liquid material. Thus, the material moves in such a direction that the surface area be reduced, so that a change in the shape occurs at the liquid level. Further, the influence of gravity can be ignored in a fine volume. Therefore, a force for movement of the liquid material is dominated by the surface tension energy.

As a result, it can be considered that the weightless liquid level acts to move from a surface state having large surface tension energy to a spherical face state, so that a liquid droplet is generated through a process in which the surface rises. Even under the control of gravity, the similar decrease occurs in a fine liquid level region. However, in a silicon fused liquid level generated by laser irradiation, coagulation occurs in a process in which droplets deviates from the liquid level, thus the entire process of a liquid droplet deviation phenomenon is not terminated. The liquid is completely solidified in a process in which the liquid droplet surface rises. As a result, a protruded dot having a protruding center is formed.

As a preferable example of the laser marking apparatus to be used for forming a dot mark shape according to a first aspect of the present invention, there is a laser marking apparatus as disclosed in Japanese Patent Laid-open Publication No. 9-323080 for example, as the present inventors proposed. A detailed structure of this apparatus will be described later, so only a brief description will be given here.

In FIG. 1, reference numeral 1 denotes a marking apparatus for marking characters, bar codes, 2D codes or the like on a surface of the object to be marked by lasers as a light source. This marking apparatus 1 comprises: a laser oscillator 2; a beam homogenizer 3 for homogenizing energy distribution of lase beam irradiated from the laser oscillator 2; a liquid crystal mask 4 to be driven for transmitting/not transmitting the lase beam in accordance with a pattern display; beam profile converting means 5 for forming and converting the energy density distribution of lase beam, which corresponds to one pixel of the liquid crystal mask 4, into a required distribution shape; and a lens unit 6 for forming an image of transmission beams of the liquid crystal mask 4 on a semiconductor wafer surface in units of dots, wherein the maximum length of the liquid crystal mask 4 per dot is 50 to 2,000 $\mu$m, and the maximum length of a dot caused by the lens unit is 1 to 15 $\mu$m.

In order to form a fine dot of such shape, it is required to control the quality and quantity of a laser beam to be emitted per a unit of dot with high precision. In order to obtain a laser beam of a fine diameter from a laser beam of a large beam diameter, a laser beam with high quality and high output is required. Because of diffraction: phenomenon caused by high output laser, it is difficult to further contract the beam. Even if such further beam contraction can be made, the lens ejection angle is increased, so that a depth of a focal point is extremely reduced. Thus, actual processing can hardly be performed. Furthermore, an ultraprecise lens system is required in terms of resolution or the like. In a case where such lens system is installed, its equipment cost is remarkably increased. Thus, its application is impossible to realize in view of cost efficiency.

In order to achieve fineness of a dot mark with a conventional lens system, it is required to divide and convert the laser beam itself emitted from the laser oscillator 2 into laser beams with small diameters that have necessary and sufficient energy for one-dot marking. Furthermore, it is required to convert the energy density distribution of laser beam per dot into a profile suitable to be processed into the aforementioned dot shape. In order to form such preferable and uniform profile, it is necessary to smoothen the energy density distribution in the laser beam per dot at an earlier stage before being thus converted.

In order to obtain a light source for the fineness, it is reasonable to employ a liquid crystal mask 4 in which a liquid crystal capable of driving and controlling transmission and non-transmission of light arbitrarily in a unit of liquid crystals of the liquid crystal mask 4 is arranged in a matrix shape based on a variety of data written in a central control section.

Further, it is necessary to convert the laser beam emitted from the laser oscillator, which has a Gaussian shaped energy density distribution as mentioned above, into a shape smoothened to be analogous to a top hat shape for example by employing the beam homogenizer 3. As for this beam homogenizer 3, there is a system for irradiating beam on an entire mask face using a fly eye lens or binary optics or a cylindrical lens and a system for operating beam on a mask face by driving mirror by means of an actuator such as polygon mirror or mirror scanner.

When it is necessary to re-convert the laser beam in which the energy density distribution is smoothened by means of the aforementioned beam homogenizer 3 into a profile of the energy density distribution preferable for obtaining the aforementioned preferable dot shape, the beam profile converter 5 is further used. This beam profile converter 5 may be, for example, a diffraction optical element; a holographic optical element; an opening mask with absorption/ transmission region or a liquid crystal mask; a depressed or convex micro-lens array or the like. In order to obtain the dot mark shape according to the present invention, this beam profile converting means is not always required.

Here, a semiconductor base material W that is an object to be marked that is employed as a processing object in the present invention is a semiconductor wafer or a circuit chip itself. The face to be marked is every cut or ground face of a semiconductor wafer or a circuit chip. Furthermore, the semiconductor wafer is typically a silicon wafer itself, but may be a wafer having an oxide film ($SiO_2$) or nitride film (SiN) on its surface. Further, it may be, an epitaxially grown wafer or a wafer having an arsenic gallium or a phosphorous indium compound on its surface.

Dimension of a fine dot mark shape that can be visualized according to the present invention are such that the maximum width along the surface of the semiconductor wafer W is 1 to 15 $\mu$m and the height of the peaked portion is 0.01 to 5 $\mu$m as described above. This dimensional range is determined by the maximum and minimum size in view: of the limit of visibility that can be ensured by a current optical sensor and a degree of freedom in options for the marking region, which have been brought from various experimental results.

According to the present invention, reflection light from a light reflection face of the dot mark is preferably received by an image receiver via an object lens. The light from the light source is irradiated to a dot mark forming face through an optical system. The thus irradiated light is reflected on the dot mark reflection face, and scattering light at an apex portion of the dot mark having a protruding shape is converged and captured by the image receiver. At this time, in the distribution of the light receiving quantity of the image receiver, a quantity of the scattering light from the dot mark is much greater than a quantity of reflection light from the mark periphery. Therefore, in the subsequent image processing, the scattering light can be sufficiently discriminated from any other reflection light, which making it possible to read a dot-mark accurately.

As a numerical aperture of the object lens is reduced, an image focal point depth becomes larger so that positioning can be easily performed. However, if the numerical aperture is too small, it requires a large amount of illumination light. Therefore, practically it is desirable that the numerical aperture i s set to be close to or slightly smaller than 0.1. On the other hand, when the numerical aperture of the object lens comes to be close to 0.13, its field of view widens, in which case a region targeted to be read can be easily aligned, but the precision of image processing is somewhat lowered. However, in a dot mark having a specific shape applied to the present invention, there is a very large difference in brightness between the dot center and its periphery. Thus, there is no remarkable inconvenience in reading a light luminance point concentrated at the center position of the dot mark. Furthermore, even if the numerical aperture of the object lens is smaller than 0.1 and the focal point depth is too large, there is a large difference in brightness between the reflection light on the surface of the object to be read and the scattering light from the dot mark surface. Thus, the dot mark can be well recognized in a wide range even with an ordinary amount of illumination light.

Therefore, in reading the above dot mark, the scattering light caused by the light irradiated to the irradiation face from obliquely above or just above. At this time, an image received by the image receiver is the same as the one when the image is visually recognized. Thus, the focal point of the image receiver may be substantially aligned with the light irradiation face in the same way as a general video camera.

Unlike a conventional case, there is no need for precious focal point alignment. Since only the center portion of the mark appears brighter with high luminance due to the specific shape of the dot mark, the dot mark can be recognized reliably as a single luminance point.

When in-coherent light is employed as said irradiation light, the light averaged on the entire irradiated face is irradiated with directivity. In comparison with a case in which coherent light is employed, the dot mark is less shaded, so that it is advantageous. However, the coherent light may also be employed as the irradiation light, which is the most advantageous in a case where the light is irradiated just above the dot mark. The maximum width of the dot mark is defined as 15 $\mu$m. In such a fine dot mark, required information can be written without restriction by a size of region for forming a dot mark, so that the options of information are increased.

As described above, the dot mark according to the present invention has a specific shape and is fine, so that it is possible not only to write but also to read a dot mark including a sufficient amount of information in a small region that could not be generally expected. The dot mark according to the present invention can be formed not only on a peripheral portion of a semiconductor wafer, particularly on an inner face of a notch portion formed at the peripheral portion, but also on a cut (ruptured) face and ground face of a semiconductor wafer or a circuit chip.

Specifically, in the method. for reading a dot mark by irradiating light onto a face for forming a dot mark; receiving its reflection light by an image receiver; and image processing an image from the imager receiver, the light is irradiated from obliquely above or just above via an irradiation optical system onto the mark forming face of the semiconductor wafer with a dot mark that protrudes upward at its central depression. Preferably, the irradiation light at this time is not parallel right but light close to natural light, and it is simultaneously irradiated to an irradiation face having a required area.

In the light irradiation face onto which the light is irradiated, mirror face processing is generally done at the periphery of the dot mark that protrudes from its surface. The light incident at an angle of $\theta$ with respect to a normal line is reflected with the same angle of $\theta$. On the other hand, almost all of the light incident to the dot mark surface scatters in various directions. Therefore, when the light irradiated from obliquely above or just above to the irradiation face is received obliquely above or just above of the dot mark, the reflection light at the periphery of the dot mark is not received by the image receiver. Part of the scattering light reflected on the surface of the dot mark is received as a luminous flux within a range of a certain sectional area. When this luminous flux is converged to be an optical image through the optical system, an optical image can be obtained with a very large difference in luminance from the periphery. Therefore, even if the dot mark is fine in size, it can be reliably recognized.

In a case where the light to be. irradiated to the forming face is an in-coherent light, an interference fringe does not occur on the image-receiving face. Moreover, the light is irradiated substantially uniformly to the irradiation face of a predetermined region irrespective of its entrance angle. Thus, an occurrence of a dot mark shade can be prevented, and a clear image can be obtained.

The marking method which is preferable to form the aforementioned fine and specific-shape dot mark on a cut face or a ground face of the semiconductor base material W includes: homogenizing the energy distribution of laser beam to be irradiated from the laser oscillator 2 by means of the beam homogenizer 3 as described above; driving and controlling the liquid crystal mask 4 which has a maximum length of 50 to 2,000 μm per pixel, thereby forming a desired pattern, and then, irradiating the laser beam uniformed by the beam homogenizer 3 to the liquid crystal mask 4; and contracting each laser beam per a dot that have transmitted through the liquid crystal mask such that the maximum width of one dot is 1 to 15 μm by means of the lens unit 6, thereby forming an image on the surface of the object to be marked.

The present inventors repeated detailed experiments as to how the laser beam wavelength, the energy density, and the pulse width influences in forming the dot mark having a specific shape according to the present invention. As a result, with respect to the wavelength, there occurred only a difference in its absorptance with respect to the semiconductor wafer, and by such value, the similar tendency was indicated with respect to the other shapes. However, when a semiconductor wafer is made of silicon for example, it is required to reduce a depth of its permeation into silicon in accordance with a reduction of the dot size, In order to obtain the dot mark shape according to the present invention. Thus, when the dot size is about 532 nm, the best result can be obtained. However, the wavelengths are different depending on the material of the object to be marked, thus, it cannot be necessarily specified.

On the other hand, the present inventors investigated a pulse width in which a permissible range of energy density is properly large, and laser output itself can be reduced to the minimum. As a result, the inventors have found that a range from 10 to 500 ns was effective in order to form the dot mark according to the present invention. In particular, 50 to 120 nm is preferable. In a case of 500 ns or more, the energy density is so large that a desired dot mark shape can be hardly obtained, and the laser oscillator itself must be unavoidably large-sized. Furthermore, in a laser processing of a ps-region, evaporation occurs significantly, so that the permissible energy density range is very limited.

In addition to the above marking conditions, either in front or back of the liquid crystal mask 4, there is arranged beam profile converting means 5 which is composed of dot matrix of the same size as the pixel matrix of the liquid crystal mask 4 and which form and convert the laser beam energy density distribution into a required distribution shape. With this beam profile converting means, a height of the peaked portion of the dot mark is adjusted by adjusting the heat distribution in an irradiation pattern dot.

Here, the maximum length of the liquid crystal mask per pixel is defined as 50 to 2,000 μm. This is because the resolution in a current lens system is limited in a case where an image is formed on the surface of the object to be marked such that the laser beam having transmitted through the liquid crystal mask 4 is contracted to be 1 to 15 μm in maximum width per dot by means of the lens system. Furthermore, in a case where the maximum length (diameter) per dot is smaller than 1 μm, it is difficult to read it per dot by a sensor of a current optical system. If the maximum size exceeds 15 μm, not only a sufficient amount of information cannot be marked, but also the marking region is also restricted. It can be understood how these values are fine, which are 3/20 to 1/100 of a maximum value of dot mark size permitted in accordance with the current SEMI specification which is 100 of μm, for example.

Even with these fine and protruded dot marks, it may be impossible to read them depending on the surface roughness of the mark forming face. According to a second aspect of the present invention, the surface roughness of the face to be marked for forming the fine and specific shape dot mark is defined as being lower than the height of the protrusion of the dot mark.

Here, the surface roughness R according to the present invention can be obtained as follows. A straight line in which top and bottom areas surrounded by a roughness curve are equal to each other is defined as a centerline. Then, a portion of the measurement length L is extracted in the centerline direction. The centerline at this extracted portion is defined as an X axis, a direction of axis is defined as a Y axis, and the roughness curve is expressed by Y=f (X). The value of the surface roughness R (in μm) is obtained by the formula below.

$$R = \{\text{integral } f(X) \text{ from } X=0 \text{ to } X=L\} \div L$$

The present inventors tried to find a value of the thus obtained surface roughness R with respect to the cut face (ground face and rupture face) in scribing line, for example, of the semiconductor wafer. As a result, it was verified that the surface roughness R of the ground face cut (ground) along the scribing line by means of a general scriber and the entire rupture face ruptured along the cut line is 5 gm or less that is the maximum value of the height of the dot mark peaked portion according to the present invention.

EMBODIMENTS OF THE INVENTION

Hereinafter, embodiments of the present invention will be described in detail with reference to the accompanying drawings by way of examples and comparative examples.

Figure 1:
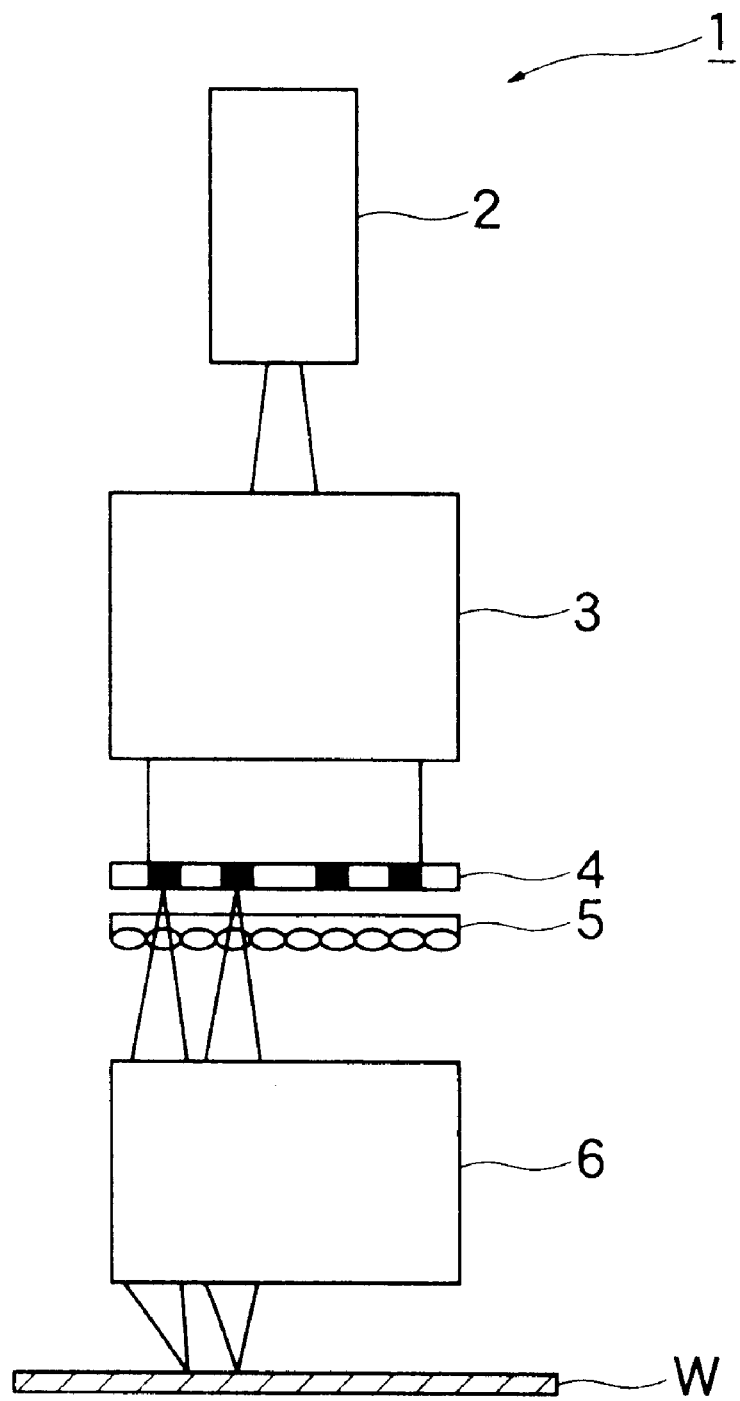
FIG. 1 is an explanatory view schematically showing a fine-dot-marking apparatus according to the present invention.
Figure 2:
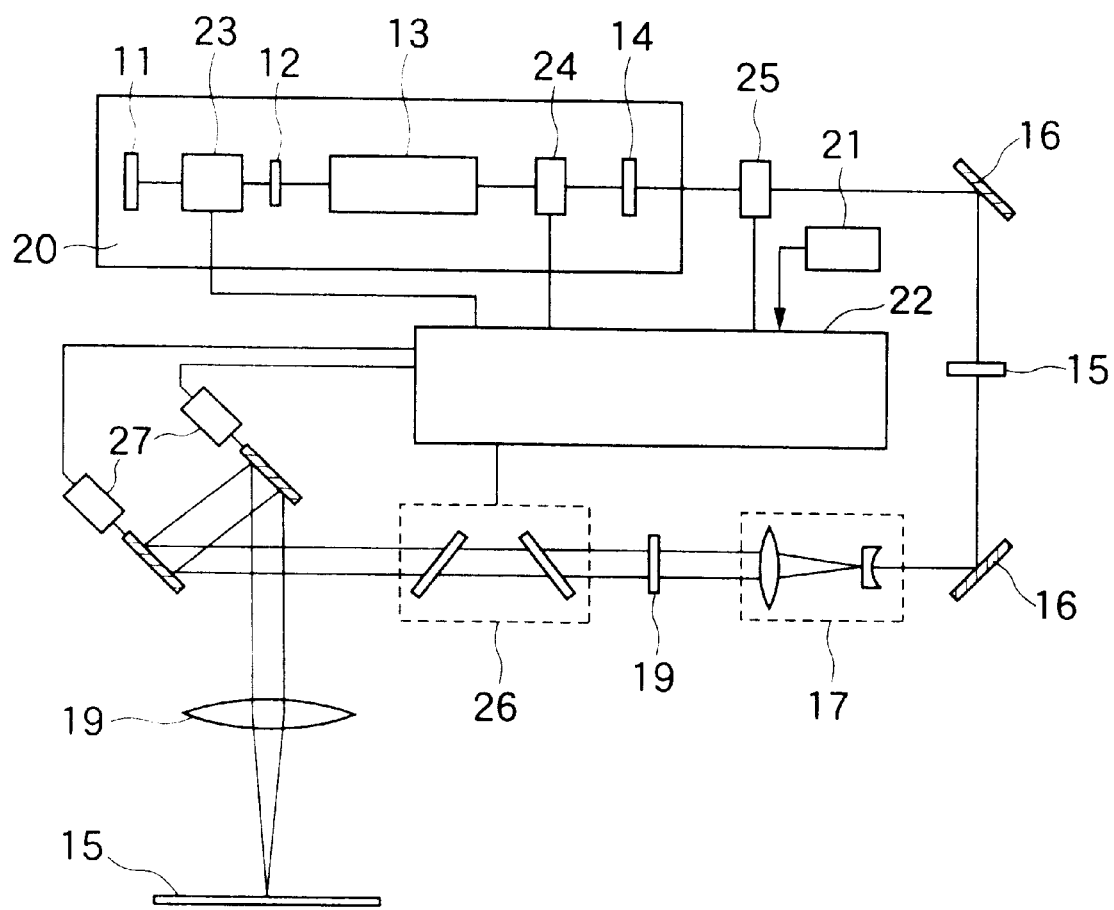
FIG. 2 is a view showing an entire structure of a general laser-beam-dot-marking apparatus.

FIG. 1 is an explanatory view schematically showing a laser marking apparatus for performing a fine dot marking according to the present invention.

In this Figure, reference numeral 2 denotes a laser oscillator; reference numeral 3 denotes a beam homogenizer; reference numeral 4 denotes a liquid crystal mask; reference numeral 5 denotes a beam profile converter; reference numeral 6 denotes a contraction lens unit; and symbol W denotes an object to be marked. Here, in this embodiment, a semiconductor wafer is shown as an example of a semiconductor base material W. The semiconductor wafer W in this embodiment, generally includes not only a silicon wafer but also a semiconductor wafer having an oxide film or a nitride film formed on its surface; an epitaxially grown semiconductor wafer; and a semiconductor wafer filmed by arsenic gallium, a phosphorous indium compound or the like. Further, the semiconductor base material may be not only a semiconductor wafer but also a variety of semiconductor devices to be manufactured with semiconductor wafers as base materials.

For example, a laser marking apparatus 1 disclosed in Japanese Patent Laid-open Publication No. 9-323080 as previously proposed by the present inventors can be used for forming a dot mark according to the present invention on a ground or cut back face in a back face of the semiconductor wafer or the like. In the apparatus 1, laser beam emitted from the laser oscillator 2 and having a Gaussian shaped energy density distribution formed into a top hat shaped energy density distribution with substantially uniform peak values through the beam homogenizer 3. The laser beam thus uniformly formed in the energy density distribution is then irradiated to a surface of the liquid crystal mask 4. At this time, the liquid crystal mask 4 makes it possible to drive liquid crystals and display a required marking pattern on the mask 4, and the laser beam transmit pixel portions which are in a state where light can be transmitted in the pattern display region. The energy density distribution of each transmitted light having been divided for each pixel and transmitted is as uniform as that formed by the beam homogenizer 3.

The above-mentioned beam homogenizer 3 is a generic name of optical parts for forming laser beam having a Gaussian shaped energy density distribution for example into a shape of homogenized energy density distribution. The optical parts may be a system in which an entire mask face top is irradiated by using a fly eye lens, binary optics or a cylindrical lens or in which the mask face top is scanned by mirror drive by means of an actuator such as polygon mirror or mirror scanner.

In the present embodiment, a region to be irradiated in the liquid crystal mask 1 at one time is 10×11 dots. This region is irradiated in one with laser beam. However, such a region of dots is often less than being required so that it does not satisfy all the number of the dots as required. Thus, in such a case, a mark pattern is divided into several segments, and the divided segments are displayed sequentially on the liquid crystal mask. These segments are combined with each other while they are switched. so that the entire mark pattern can be formed on the wafer surface. In this case, when an image is formed on the wafer surf ace, it is, of course, required to control and move the wafer or the, irradiation position. As such control means, there can be employed a variety of methods that have been known conventionally.

In the present embodiment, laser beam in units of dots passing through the liquid crystal mask 4 Is successively irradiated to the beam profile converter 5. This beam profile converter 5 is arranged in a matrix shape similarly to the liquid crystal mask 4 where liquid crystals are arranged in a matrix shape so as to correspond to the individual liquid crystals. Therefore, the laser beam having transmitted the liquid crystal mask 4 pass through the beam profile converter 5 by the dot correspondingly one to one. Then, the laser beam in the energy density distribution homogenized respectively by means of the beam homogenizer 3 is converted into such an energy density distribution shape that is required to form a fine hole shape specific to the present invention. In the present embodiment, the laser beams that have passed through the liquid crystal mask 4 pass through the beam profile converter 5 so that the energy density distribution shape is converted as described above. These beams may be directly introduced into the next lens unit 6 without being converted into the profile of the energy density distributions by the beam profile converter 5.

The laser beams that have passed through the beam profile converter 5 are narrowed by means of the lens unit 6 and then irradiated to a predetermined position of the back face of the semiconductor wafer W, whereby a dot marking as required for the surface is performed. In the present embodiment, the maximum length of the pixel unit of the liquid crystal is defined as 50 to 2,000 μm. The laser beam is narrowed to 1 to 15 μm on the surface of the semiconductor wafer W by means of the lens unit 6. Here, in a case where an attempt is made to uniformly form marking of microns on a plurality of wafer surfaces, it is required to adjust a distance between the marking face and the light focusing lens and its light axis alignment by the micron. According to the present embodiment, focal point detection undergoes height measurement by means of a confocal system generally used in a laser microscopy or the like, whereby the resultant measurement value is fed back to a fine positioning mechanism in a longitudinal direction of the lens so that the focal point is automatically positioned. Further, a generally known method may be employed for the light axis alignment and positioning and adjustment of the optical constituent elements. For example, these may be adjusted by a screw adjustment mechanism in order to conform to a preset standard spot through guide light such as He—Ne laser. This adjustment may be made only once during assembling.

Therefore, a fine dot mark according to the present invention is within a dimensional range of 1 to 15 μm. in maximum width. In consideration of a case in which a periphery of its peaked portion is slightly depressed, the protruding and depressing dimensions are defined as 0.01 to 5 μm. In forming a dot mark with such dimensions, it is necessary that the length of one side of a dot in the liquid crystal mask 4 should be 50 to 2,000 μm, in order to prevent corruption of a formed image at an irradiation point on the surface of the semiconductor wafer W caused by the resolution of the a contraction lens unit. Further, if a disposition interval between the beam profile converter 5 and the liquid crystal mask 4 is excessively large or small, the image formed on the semiconductor wafer surface is liable to be distorted under influence of the peripheral beams or under influence of unstableness of the optical axis. Therefore, in the present invention, a disposition interval X between the beam profile converter 5 and the liquid crystal mask 4 is set to be 0 to 10 times of the maximum length Y a single pixel of the liquid crystal mask 4. Because the disposition interval is set within such a range, a formed image irradiated onto the wafer surface becomes clear.

The above beam profile converter 5 is one of the optical parts for converting the energy density distribution homogenized by the beam homogenizer 3 into the shape of an optimal energy density distribution in order to a dot shape specific to the present invention. By this converter, diffraction phenomenon, refraction phenomenon or light transmittance at a laser irradiation point can be arbitrarily differentiated, whereby a profile of the energy density distribution of the incident laser. beam can be converted into an arbitrary shape. The optical parts may include a diffraction light optical element, a holographic optical element, a convex microscopic lens array and a liquid crystal itself. These parts are disposed in a matrix and are used as the beam profile converter 5.

Figure 3:
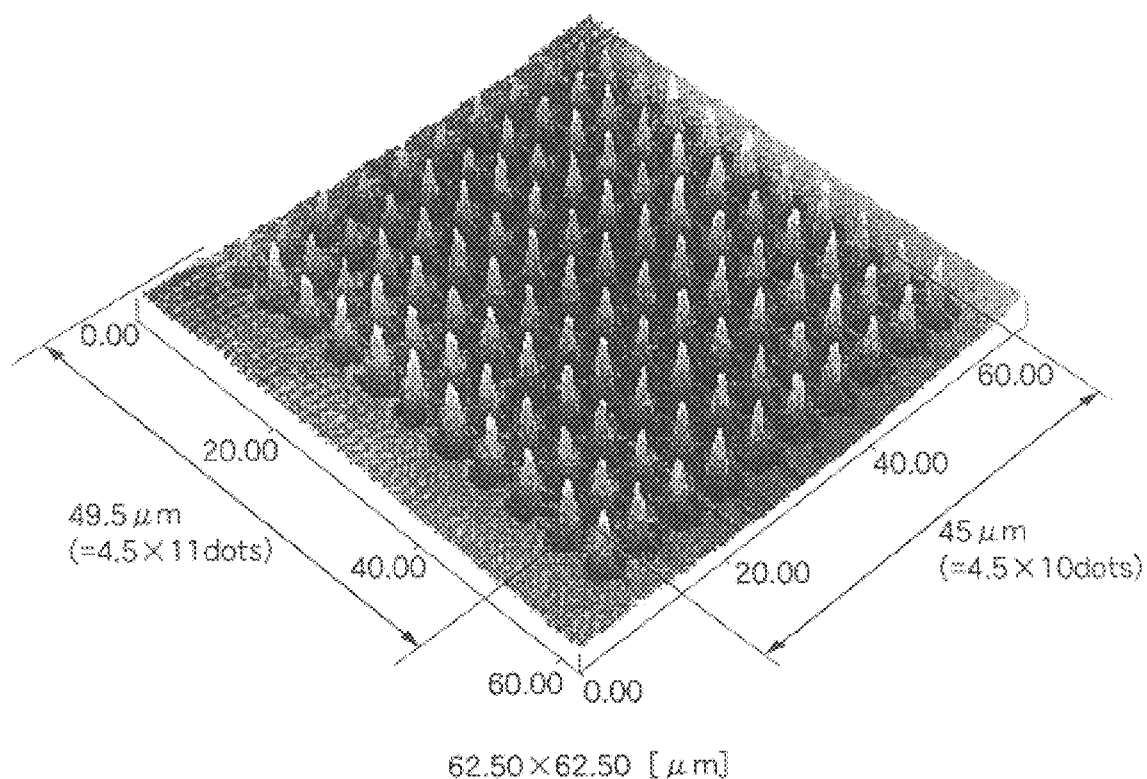
FIG. 3 is a three-dimensional view of AFM observation, showing a dot mark shape and its arrangement state formed by a method according to the present invention.
Figure 4:
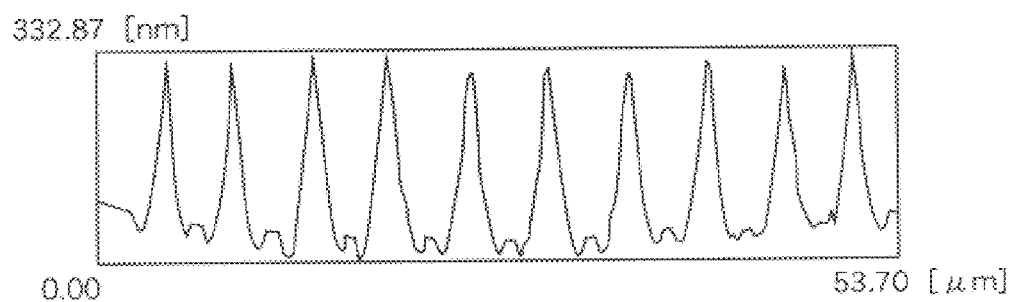
FIG. 4 is a sectional view of FIG. 3.

FIGS. 3 and 4 respectively show a typical example of a shape of a dot mark formed by the method according to the present invention and its arrangement. FIG. 3 is a three-dimensional view observed by AFM, and FIG. 4 is a sectional view of the same observed by AFM. According to these Figures, each of the dot marks formed on the surface of the semiconductor wafer W is 3.6 μm in square; the height of each dot is substantially 333 nm; and the dot interval is 4.5 μm. As can be understood from these Figures, a substantially cone shaped dot mark is formed on the surface of the semiconductor wafer W by each laser beam divided so as correspond to each pixel of the liquid crystal mask 4. Moreover, the dot marks are arranged in order in 11×10 dots in square, and the respective heights are substantially uniform. This is because the energy distribution of the laser beam irradiated to the liquid crystal mask 4 has been uniformly homogenized by the beam homogenizer 3.

Figure 5:
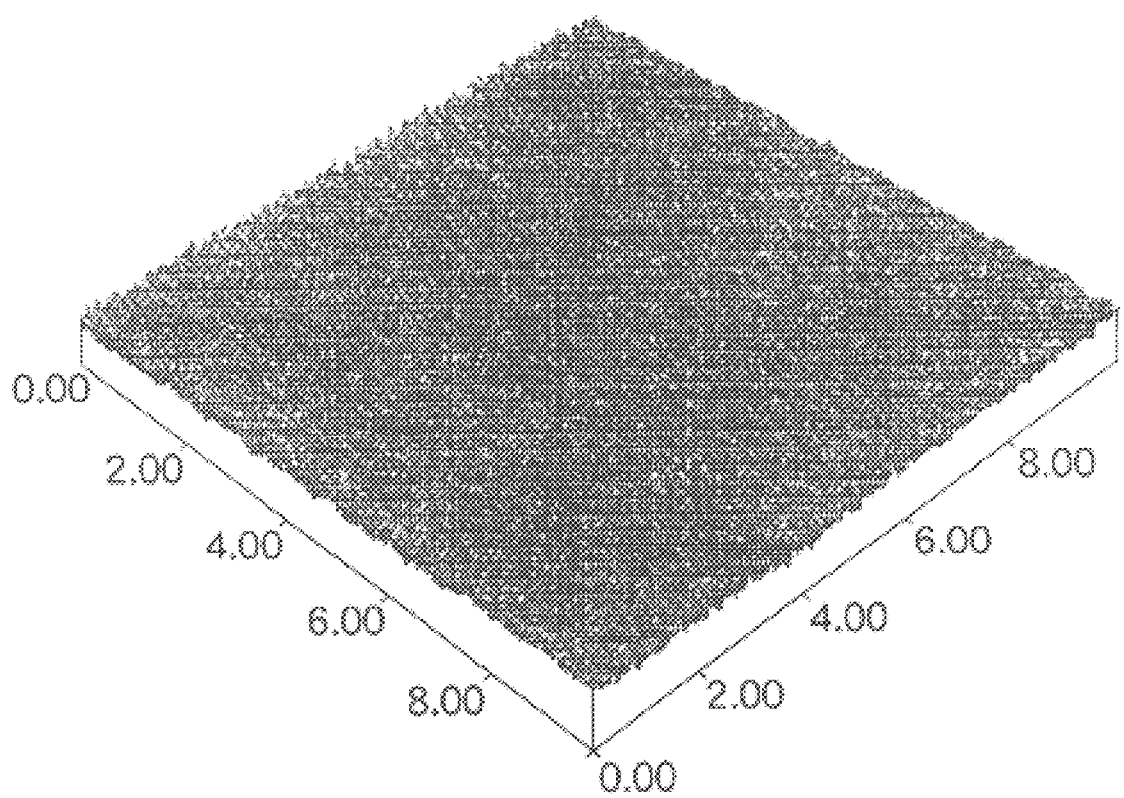
FIG. 5 is a three-dimensional view of AFM observation, showing a state of a semiconductor wafer surface having been mirror finished.
Figure 6:
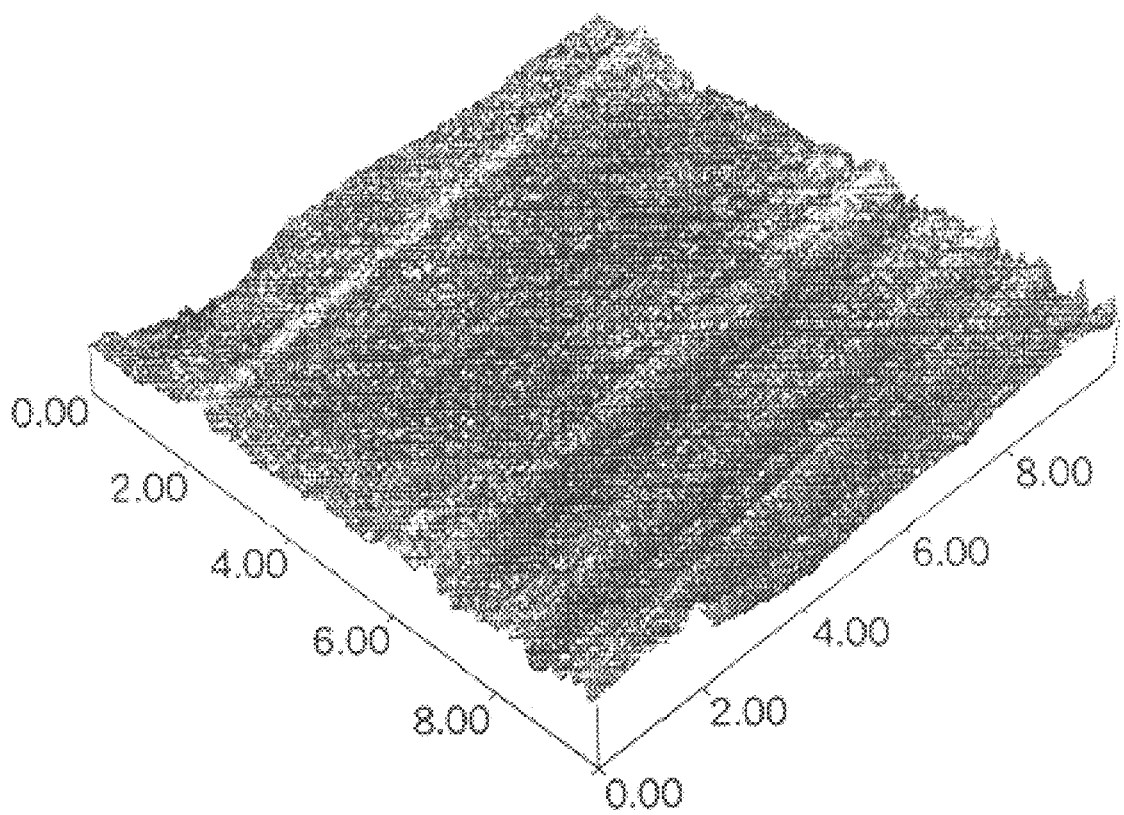
FIG. 6 is a three-dimensional view of AFM observation, showing a state of a cut face of the semiconductor wafer.

With respect to the dot mark having such shape and dimensions, an attempt was made to find a surface roughness R of a mirror-finished wafer surface and a wafer cut face by a dicer. As shown in FIGS. 5 and 6, the maximum protruded height of the former is 4.54 nm, while the maximum protruded height is 114.87 nm, so that it has been verified that even in the cut face, the above dot mark can be well read.

FIGS. 7 to 10 respectively show a dot mark shape specific to the present invention formed under the condition according to the method of the present invention by means of the above-described laser marking apparatus 1 applied to the present embodiment, and a dot mark shape formed under another condition by using the apparatus 1. The specification of the laser marking apparatus 1 is given below:

| | |
|---|---|
| Laser medium: | Nd, YAG laser |
| Laser wavelength: | 532 nm |
| Mode: | TEM00 |
| Average output: | 4 W @ 1 KHz |
| Pulse width: | 100 ns @ 1 KHz |

The following preliminary experiments were carried out with respect to the laser beam wavelengths for reducing the present invention into practice. That is, the laser beam wavelengths were set to be three patterns: 355 nm, 532 nm, and 1064 nm. As in Examples and Comparative Examples of the present invention which will be described later, a variety of preliminary experiments were carried out by setting the energy density in a range of 0.14 to 3.1 J/cm$^2$, and the pulse width in a range of 10 to 700 nm and 20 ps. As a result, although there is a difference in silicon absorption ratio between the laser beam wavelengths of 532 nm and 1064 nm, the same tendency was monitored as a whole. However, the depth of permeation into silicon was smaller in the wavelength of 532 nm, and in Particular, the better result was obtained as the dot becomes smaller. On the other hand, when the laser beam wavelength is set to be 355 nm, the depth of permeation into silicon is too small, so that evaporation on the silicon surface is prone to occur. Therefore, in the present embodiment, the laser beam wavelength is set to be 532 nm. However, in the present invention, the laser beam wavelength should not be specified.

The laser beam to be used in the present embodiment may be any of those oscillated by a YAG laser oscillator, a second high frequency wave of a YV04 laser oscillator, a titanium sapphire laser oscillator or the like.

In addition to the above marking conditions, FIGS. 7 to 9 respectively show dot shapes and their respective dimensions corresponding to Examples 1 and 2 and Comparative Examples 1 and 2 when the dot diameter of one dot irradiated to the surface of the semiconductor wafer W, the energy density of laser beam, and the pulse width are changed as shown in the following shown Table 1.

TABLE 1

| | Dot diameter (μm) | Energy density (J/cm$^2$) | Dot mark shape |
|---|---|---|---|
| Example 1 | 7.2 | 1.67 | Center peaked |
| Comparative Example 1 | 7.2 | 0.96 | Center depressed |
| Example 2 | 3.6 | 3.10 | Center peaked |
| Comparative Example 2 | 30 | 0.43 | Center depressed |

Figure 7A:
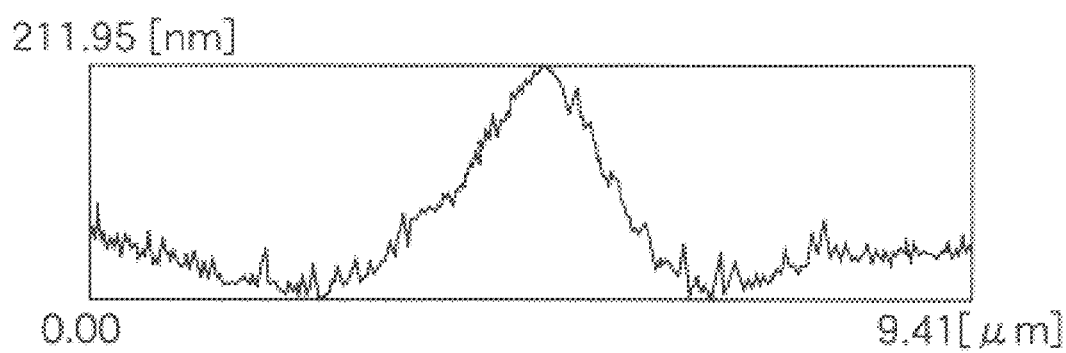
FIGS. 7(A) and 7(B) are a sectional view and a three-dimensional view of AFM observation, showing a dot mark shape according to Example 1, respectively.
Figure 7B:
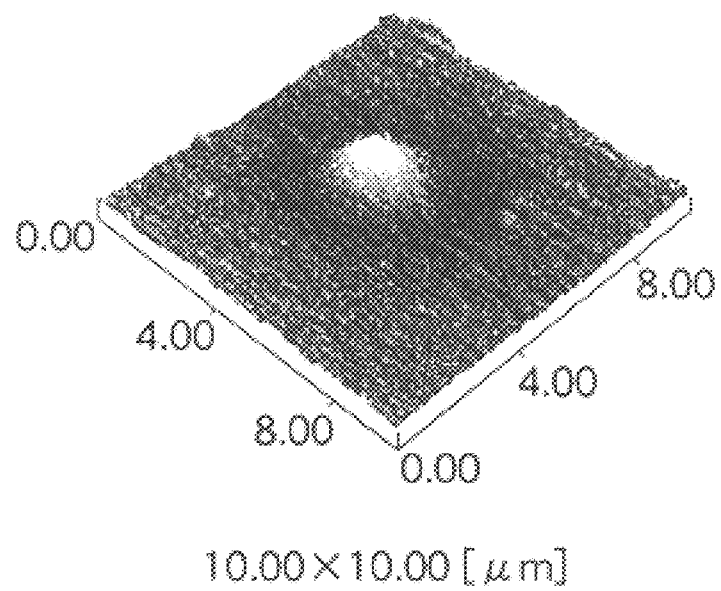
Figure 8A:
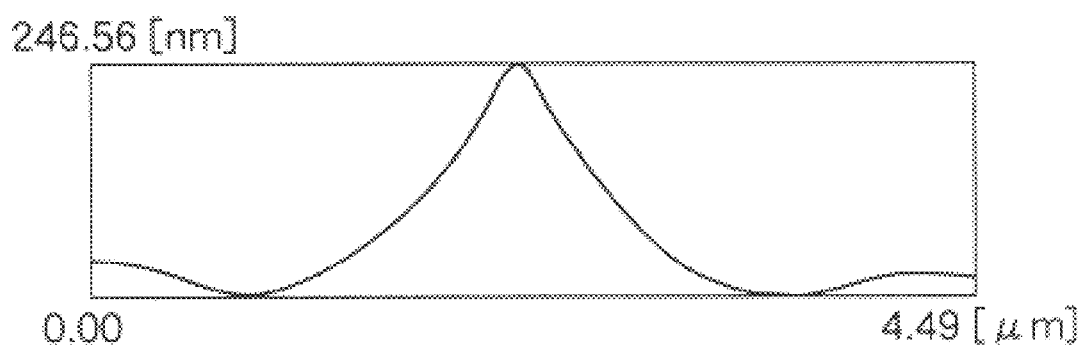
FIGS. 8(A) and 8(B) are a sectional view and a three-dimensional view of AFM observation, showing a dot mark shape according to Example 2, respectively.
Figure 8B:
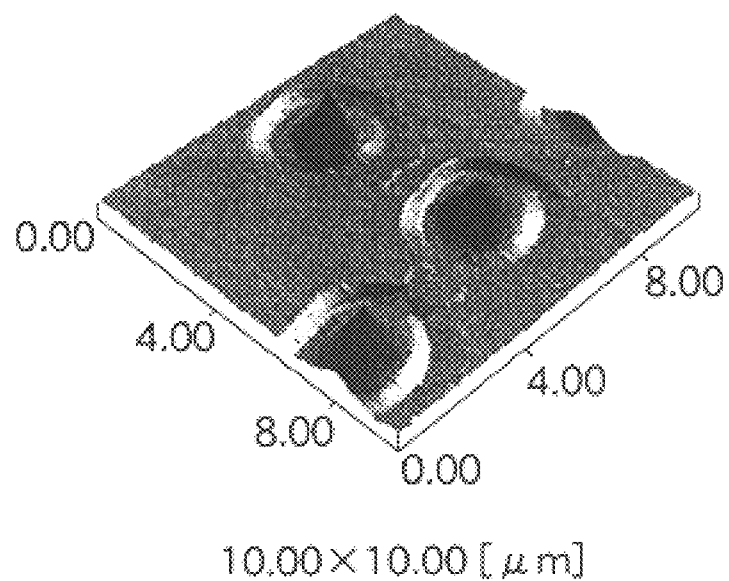

FIGS. 7 and 8 respectively show dot mark shapes and their respective dimensions when dot marking is applied to the surface of the semiconductor wafer W under the respective marking conditions according to Examples 1 and 2. According to these Figures, a high, substantially cone shaped upwardly peaked portion is provided. Even in this dot shape, there is a large difference in brightness from the periphery, and sufficient visibility is ensured.

Figure 9A:
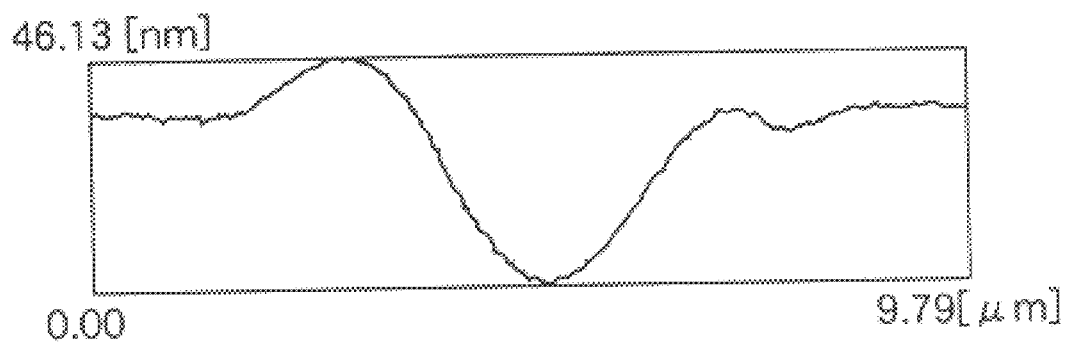
FIGS. 9(A) and 9(B) are a sectional view and a three-dimensional view of AFM observation, showing a dot mark shape according to Comparative Example 1, respectively.
Figure 9B:
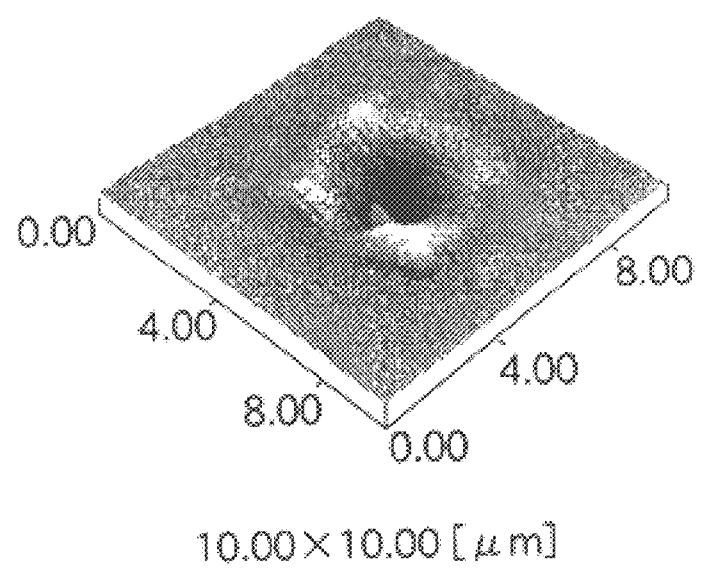

In Comparative Example 1 shown in FIG. 9, although the dot length (the length of one side of a rectangle is 7.2 μm) is the same as those shown of Examples 1 and 2, the energy density is 0.96 (<10) J/cm$^2$. Thus, large depression appears at the center portion, and a difference in height between the depression and the protrusion is significantly smaller than that shown in Examples 1 and 2, so that its visibility is inferior.

Figure 10A:
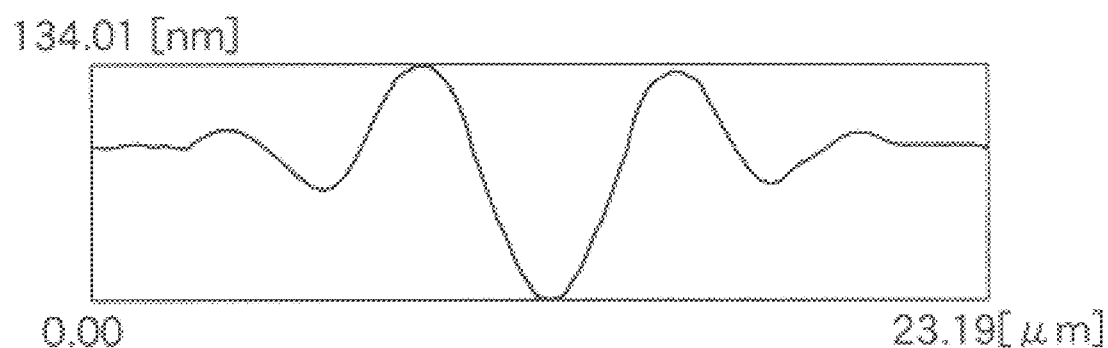
FIGS. 10(A) and 10(B) are a sectional view and a three-dimensional view of AFM observation showing a dot mark shape according to Comparative Example 2, respectively.
Figure 10B:
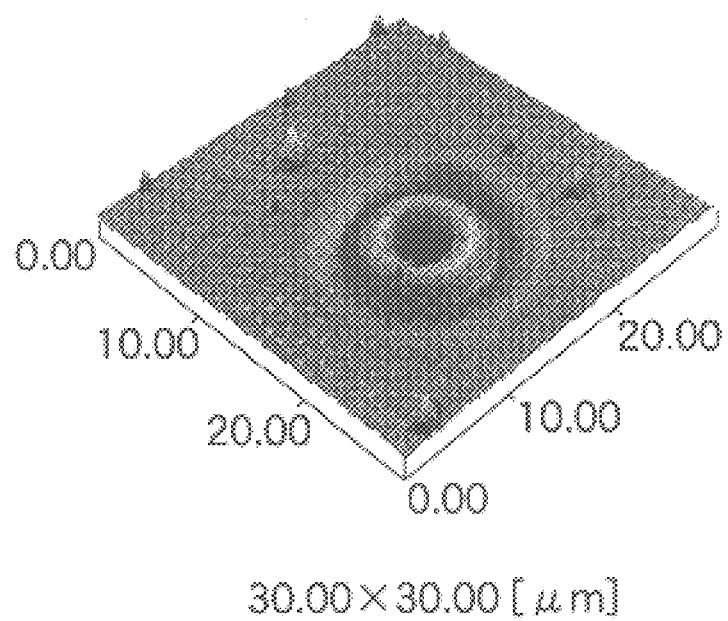

In Comparative Example 2 shown in FIG. 10, as shown in Table 1, it exceeds 1 to 15 μm of the length of a target dot mark in the present invention (the maximum width along the surface of the semiconductor wafer W). Thus, this Comparative Example should be excluded from the embodiment of the present invention irrespective., of whatever the dot shape may be. The visibility is inferior except.a.case in which large depression appears at the center portion, and particularly, multiple shallow circular depressions are formed at the periphery of the center portion so that a contrast between center portion and the peripheral flat portion is small, and a large dot mark is formed.

The following results were obtained from a variety of experiments.
(1) As the diameter (the maximum length dimension) of a dot mark is smaller, a peaked portion is more likely to be formed. Further, as the diameter of the dot mark is smaller, the length of the free interface is smaller. The viscosity of a silicon solution is constant when the temperature is constant, so that the low-order vibration mode becomes dominant.
(2) As the diameter of the dot mark is smaller, larger energy density is required in order to form peaked portions of the same heights. Namely, this case corresponds to a case in which a distance between the fixed ends, is reduced while the film vibration amplitude is kept unchanged. As the distance between the fixed ends is smaller, larger external force (temperature distribution caused by pulse irradiation=surface tension) is required.
(3) In a dot mark of a certain size, a low-order mode having a peaked portion is always entered. For example, when the dot mark diameter is 3.6 μm, all of the dot marks of any shapes have peaked portions.
(4) In a dot of a certain size or more, a depressed shaped vibration mode is always entered. Namely, a polarized point between a case in which a convex shape is dominant and a case in which a depressed shape is dominant exists between the dot marks having diameters of 20 to 30 μm. This value is uniquely determined from the viscosity of the silicon solution, the depth of a fused pond, and the size of the fused pond (the dot mark diameter).

As is evident from the above findings, according to the present invention, it is possible to precisely and neatly uniform a single, fine dot mark having a uniform shape with a size that is 3/20 to 1/10 of a conventional size in a region of a single dot on the surface of the semiconductor wafer. Moreover, the dot mark has a specific protruding shape at its center portion, which could not be seen conventionally. Thus, the dot mark shape has superior visibility, and well functions as a 2D code.

Figure 11:
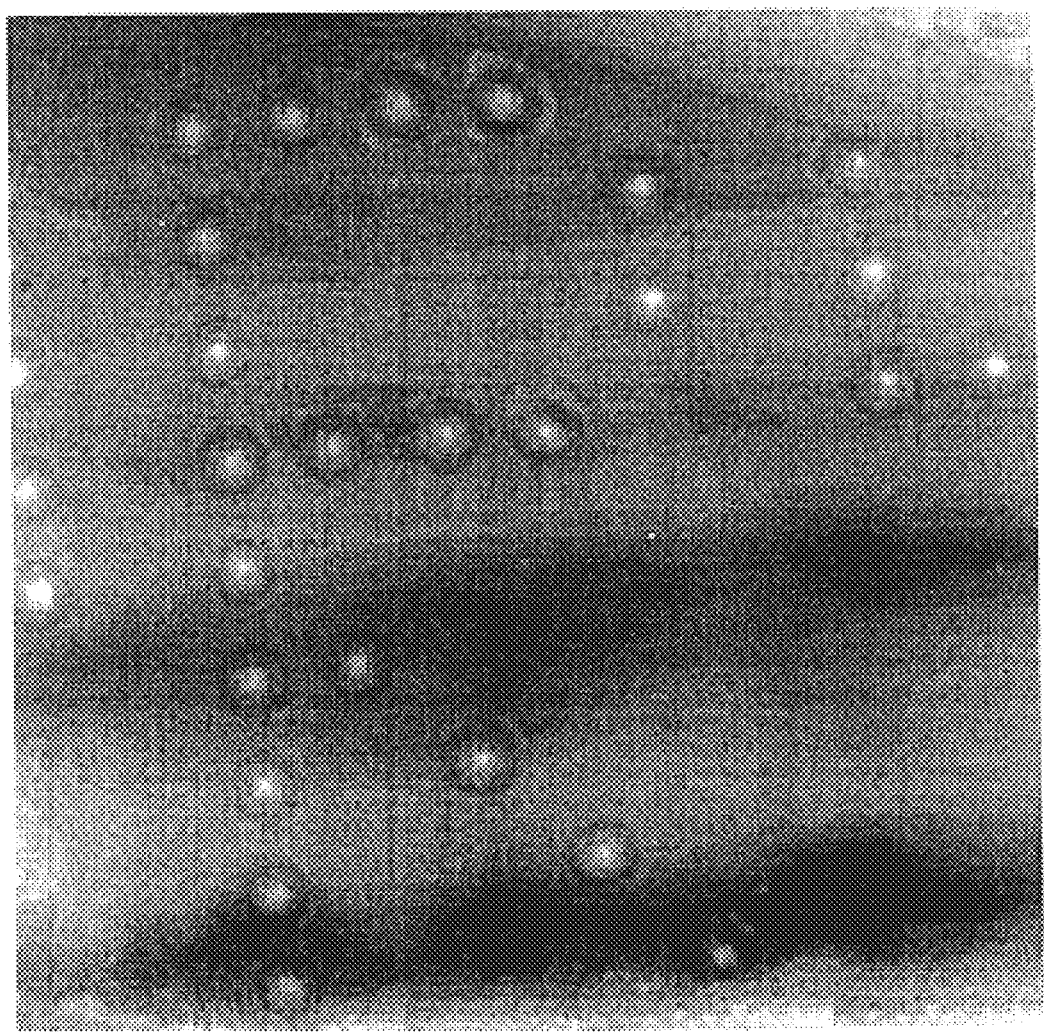
FIG. 11 is a three-dimensional view of AFM observation, showing a state of a ground face of a semiconductor wafer having a dot mark formed thereon according. to the present invention.
Figure 12:
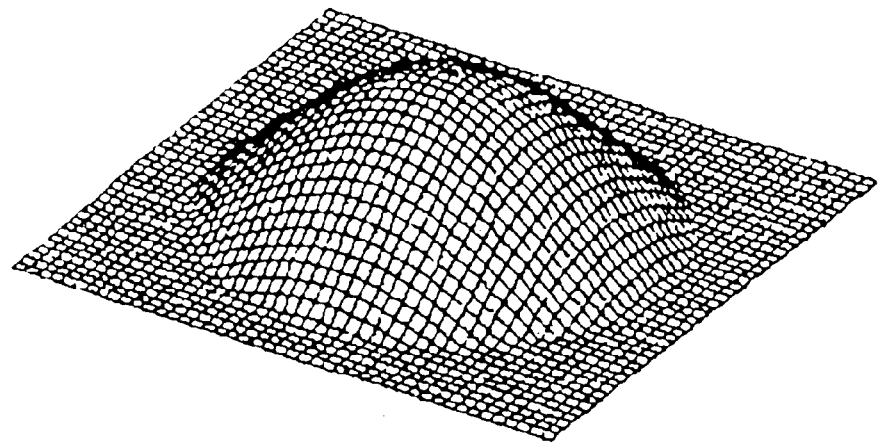
FIG. 12 is a three-dimensional view schematically showing a first example of a dot mark shape based on a vibration mode of a fused pond surface in a dot mark forming process.
Figure 13:
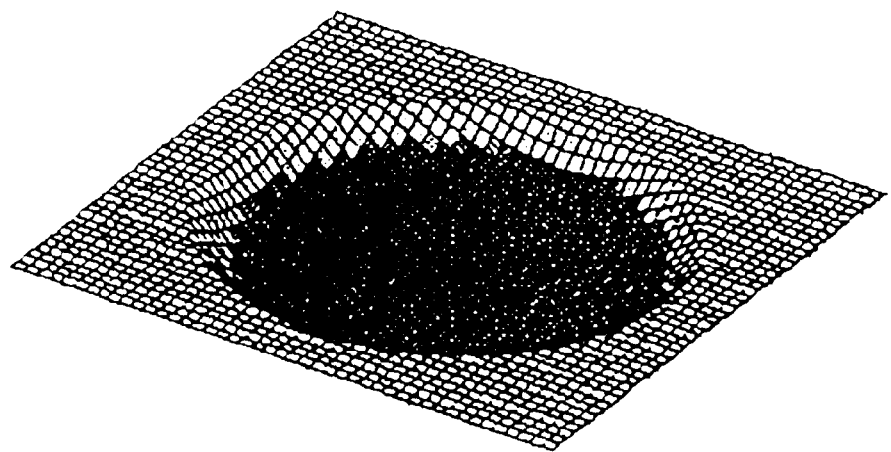
FIG. 13 is a three-dimensional view schematically showing a second example of the dot mark shape.
Figure 14:
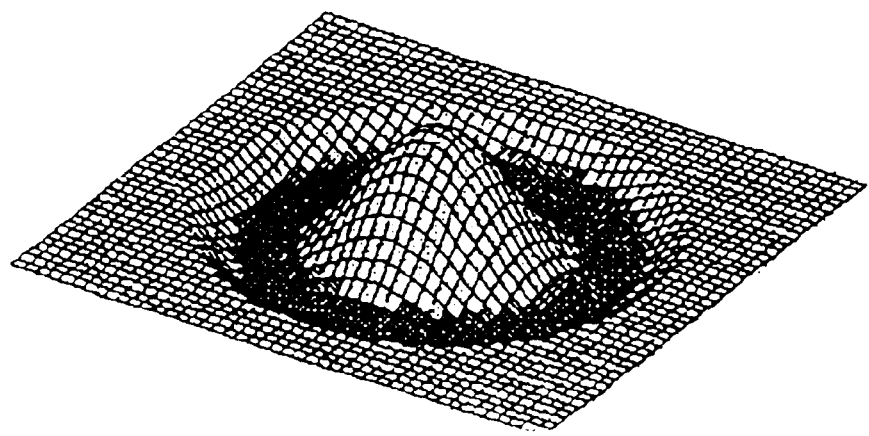
FIG. 14 is a three-dimensional view schematically showing a third example of the dot mark shape.
Figure 15:
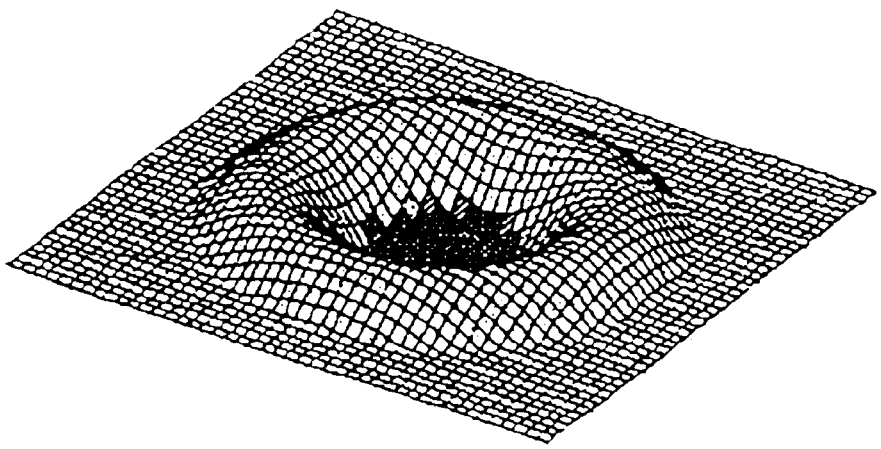
FIG. 15 is a three-dimensional view schematically showing a fourth example of the dot mark shape.
Figure 16:
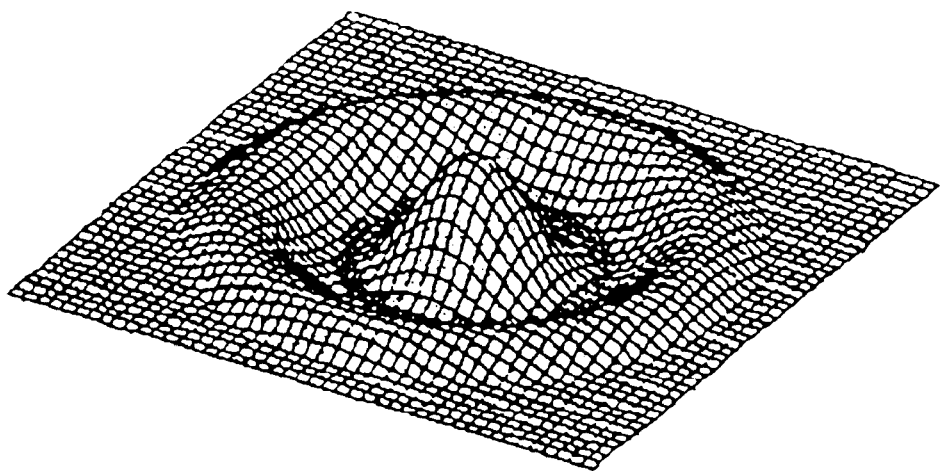
FIG. 16 is a three-dimensional view schematically showing a fifth example of the dot mark shape.
Figure 17:
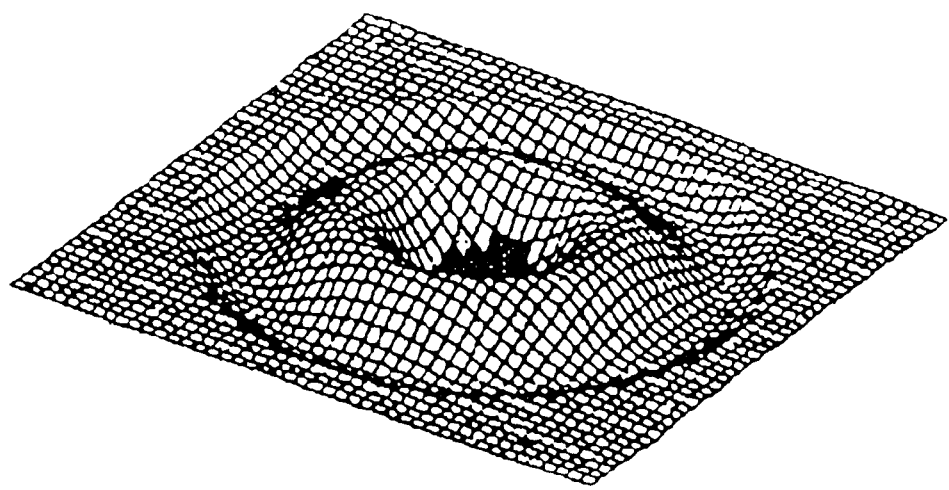
FIG. 17 is a three-dimensional view schematically showing a sixth example of the dot mark shape.
Figure 18:
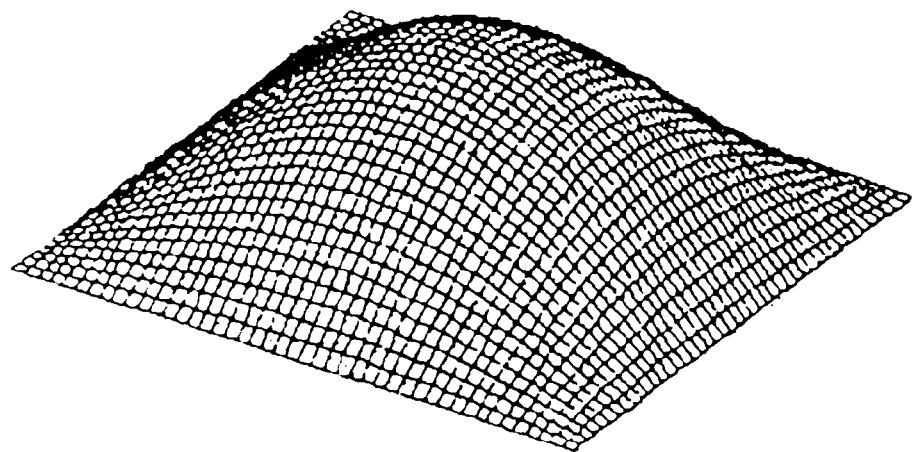
FIG. 18 is a three-dimensional view schematically showing a seventh example of the dot mark shape.
Figure 19:
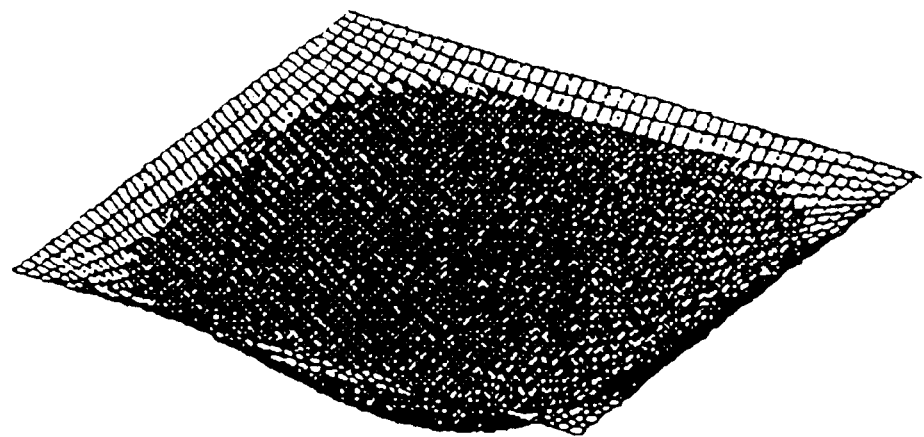
FIG. 19 is a three-dimensional view schematically showing an eighth example of the dot mark shape.
Figure 20:
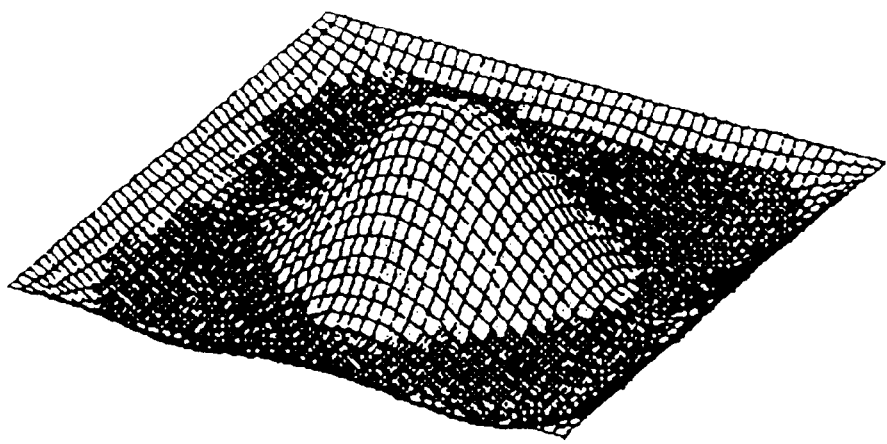
FIG. 20 is a three-dimensional view schematically showing a ninth example of the dot mark shape.
Figure 21:
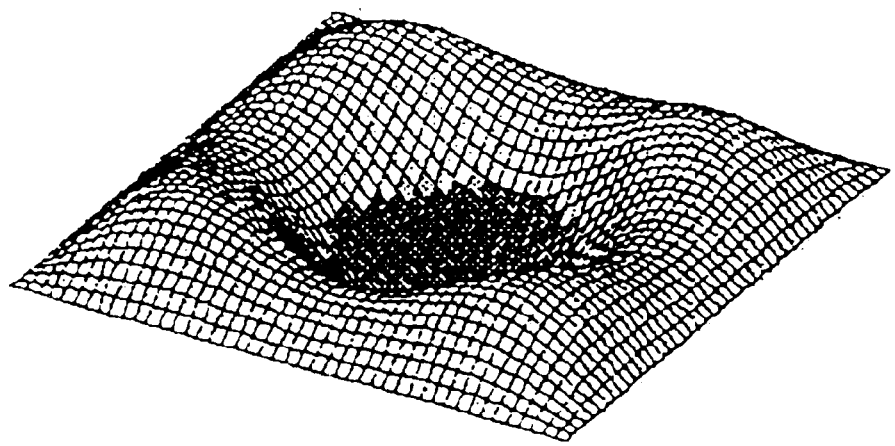
FIG. 21 is a three-dimensional view schematically showing a tenth example of the dot mark shape.

FIG. 11 is a plan view showing a dot mark according to the present invention which is formed on a cut face of a V notch whose surface roughness is considered to be the largest. As can be understood from the Figure, according to the present invention, even if a fine dot mark is formed on an entire cut face and ground face of the semiconductor wafer W, sufficient visibility can be ensured due to its protruded shape.

Further, the size of the dot mark according to the present invention is significantly smaller than that of a conventional dot mark, and moreover, an interface between adjacent dot marks can be clearly discriminated. Thus, many dot marks can be formed in the same region, so that its marking region is significantly increased. Further, an option of a marking region can be larger.

That is,
(1) Marking can be applied to a wafer surface at an arbitrary time.

For example, wafer shipment inspection data or the like can be marked without being influenced by applications of a device manufacturer to which the wafers are to be delivered, at the time of silicon manufacturer's shipment. Similarly, in the device manufacturer, wafer ID marks specific to a device manufacturer as well as inspection data can be marked in an arbitrary process. Further, at the time of wafer shipment of each wafer, the inspection data of each chip, specific wafer ID, and chip ID can be marked at notches or at corners of an orientation flat. Thus, such a problem that a mark is too small to find is completely eliminated.
(2) In particular, in the present invention, the dot mark can be formed on a cut face of the semiconductor wafer. Thus, marking can be performed in every step of semiconductor manufacturing, and a processing history from a wafer to a final product can be recognized in units of final chips.
(3) Many more chips can be obtained from a single wafer.

Conventionally, even in a notch, it was required to make a chip design by sectioning a wafer in an arc shape in order to keep a marking region. In contrast, according to the present invention, a dedicated marking region can be eliminated from a wafer surface, so that the effective chip region can be enlarged. As a result, this invention can directly contribute to improvement in wafer yield.
(4) Design burden is reduced.

It is advantageous according to the present invention that marking can be performed for an entire cut face or ground face of a wafer, and the face to be marked is, of course, in a state of bare wafer. Therefore, a designer can layout chips freely because there is no need to consider a marking region at the chip design stage or later.

What is claimed:

1. A semiconductor base material wherein a dot mark having at its center a peaked portion rising from a face to be marked is provided on a cut face or ground face of a semiconductor wafer by irradiation of laser beam, a maximum width of the dot mark along the face to be marked being 1 to 15 μm and a height of the dot mark from a non-dot-mark surface in a marking area is 0.01 to 5 μm.

2. A semiconductor base material according to claim 1, wherein surface roughness of said face to be marked satisfying the following formula is smaller than the height of said peaked portion of the dot mark:

$$R = \{\text{Integral } f(X) \text{ from } X=0 \text{ to } X=L\} \div L,$$

in which L denotes, when a straight line in which top and bottom areas surrounded by a roughness curve are equal is defined as a centerline, a length of an extracted portion in a longitudinal direction of the centerline; X denotes a position in the centerline from an end portion of L; and Y (=f(X)) denotes a height at said position X of the roughness curve.

* * * * *